US012405606B2

(12) United States Patent
Deodhar et al.

(10) Patent No.: US 12,405,606 B2
(45) Date of Patent: Sep. 2, 2025

(54) SYSTEM AND METHOD FOR PERFORMANCE AND HEALTH MONITORING TO OPTIMIZE OPERATION OF A PULVERIZER MILL

(71) Applicant: Tata Consultancy Services Limited, Mumbai (IN)

(72) Inventors: Anirudh Deodhar, Pune (IN); Tathagata Mukherjee, Pune (IN); Rajan Kumar, Pune (IN); Venkataramana Runkana, Pune (IN)

(73) Assignee: Tata Consultancy Services Limited, Mumbai (IN)

( * ) Notice: Subject to any disclaimer, the term of this patent is extended or adjusted under 35 U.S.C. 154(b) by 210 days.

(21) Appl. No.: 17/578,964

(22) Filed: Jan. 19, 2022

(65) Prior Publication Data

US 2022/0236728 A1    Jul. 28, 2022

(30) Foreign Application Priority Data

Jan. 22, 2021 (IN) .............................. 202121003172

(51) Int. Cl.
  *G05B 23/02*    (2006.01)
  *B02C 25/00*    (2006.01)
  (Continued)

(52) U.S. Cl.
  CPC .......... *G05B 23/0283* (2013.01); *B02C 25/00* (2013.01); *G05B 23/0221* (2013.01);
  (Continued)

(58) Field of Classification Search
  None
  See application file for complete search history.

(56) References Cited

U.S. PATENT DOCUMENTS

| | | | |
|---|---|---|---|
| 7,182,283 B1 * | 2/2007 | Santucci | B02C 15/06 |
| | | | 241/117 |
| 9,389,761 B2 * | 7/2016 | Roaldson | G06F 3/0482 |

(Continued)

FOREIGN PATENT DOCUMENTS

| | | |
|---|---|---|
| JP | 5856899 B2 | 2/2016 |
| JP | 2019-141796 A | 8/2019 |
| WO | WO-2017216647 A1 * | 12/2017 |

OTHER PUBLICATIONS

Liang, Xiufan; Li, Yiguo; Wu, Xiao; Shen, Jiong; and Pan, Lei—"Dynamic modeling and inferential control of the pulverizing system in coal-fired power plant"; 2018 IEEE Conference on Control Technology and Applications (CCTA), Copenhagan, Denmark, Aug. 21-24, 2018 (Year: 2018).*

(Continued)

*Primary Examiner* — Arleen M Vazquez
*Assistant Examiner* — Leonard S Liang
(74) *Attorney, Agent, or Firm* — Finnegan, Henderson, Farabow, Garrett & Dunner, LLP

(57) ABSTRACT

Pulverizers are very critical equipment in overall functioning of a plant. They need to be controlled and monitored properly for the optimized operation of the pulverizers. A system and method for performance and health monitoring to optimize operation of a pulverizer is provided. The system comprises a digital twin that can mimic the performance of the pulverizer in real-time and assist the operators in decision making related to operation, maintenance and scheduling. The digital twin is configured to receives real-time sensor data from a plurality of data sources and provides real-time soft sensing of key health and performance parameters of the pulverizer. One more key aspect of the solution is the advisory system that alerts and recommends corrective actions in terms of parameters controlled through other (Continued)

equipment or changes in operation or design or changes in cleaning schedule.

6 Claims, 8 Drawing Sheets

(51) Int. Cl.

| | | |
|---|---|---|
| B02C 15/00 | (2006.01) | |
| B02C 15/04 | (2006.01) | |
| B02C 23/04 | (2006.01) | |
| F23K 1/00 | (2006.01) | |
| G01V 20/00 | (2024.01) | |
| G05B 13/04 | (2006.01) | |
| G05B 19/418 | (2006.01) | |
| G06F 30/20 | (2020.01) | |
| G06F 30/27 | (2020.01) | |
| G06N 3/044 | (2023.01) | |
| G06N 3/045 | (2023.01) | |
| G06N 3/047 | (2023.01) | |
| G06N 3/08 | (2023.01) | |
| G06N 3/084 | (2023.01) | |
| G06N 5/02 | (2023.01) | |
| G06N 5/04 | (2023.01) | |
| G06N 7/01 | (2023.01) | |
| G06N 20/00 | (2019.01) | |
| G06Q 10/04 | (2023.01) | |
| G06Q 10/20 | (2023.01) | |

(52) U.S. Cl.
CPC .............. *B02C 15/00* (2013.01); *B02C 15/04* (2013.01); *B02C 23/04* (2013.01); *F23K 1/00* (2013.01); *G01V 20/00* (2024.01); *G05B 13/04* (2013.01); *G05B 13/048* (2013.01); *G05B 19/41885* (2013.01); *G05B 23/02* (2013.01); *G05B 23/0294* (2013.01); *G05B 23/0297* (2013.01); *G06F 30/20* (2020.01); *G06F 30/27* (2020.01); *G06N 3/044* (2023.01); *G06N 3/045* (2023.01); *G06N 3/047* (2023.01); *G06N 3/08* (2013.01); *G06N 3/084* (2013.01); *G06N 5/02* (2013.01); *G06N 5/04* (2013.01); *G06N 7/01* (2023.01); *G06N 20/00* (2019.01); *G06Q 10/04* (2013.01); *G06Q 10/20* (2013.01); *Y02P 90/02* (2015.11)

(56) References Cited

U.S. PATENT DOCUMENTS

| | | | | |
|---|---|---|---|---|
| 9,863,854 | B2* | 1/2018 | Axness | G05B 19/41875 |
| 10,430,038 | B2* | 10/2019 | Williams | G06T 11/206 |
| 10,838,583 | B2* | 11/2020 | Tappan | G08B 21/18 |
| 2004/0181298 | A1* | 9/2004 | Rogers | G06Q 30/0283 |
| | | | | 700/36 |
| 2005/0263630 | A1* | 12/2005 | Zhang | B02C 23/04 |
| | | | | 241/100 |
| 2012/0111978 | A1* | 5/2012 | Murphy | B02C 15/04 |
| | | | | 241/25 |
| 2014/0136455 | A1* | 5/2014 | Cheng | G05B 15/02 |
| | | | | 700/20 |
| 2014/0324367 | A1* | 10/2014 | Garvey, III | G01D 18/00 |
| | | | | 702/56 |
| 2015/0039266 | A1* | 2/2015 | Axness | G01M 99/005 |
| | | | | 702/182 |
| 2015/0186483 | A1* | 7/2015 | Tappan | G06F 3/0481 |
| | | | | 707/737 |
| 2018/0321836 | A1* | 11/2018 | Tappan | G06F 16/287 |
| 2020/0012918 | A1* | 1/2020 | Malhotra | G06N 3/084 |
| 2020/0364386 | A1* | 11/2020 | Tang | G05B 17/02 |
| 2021/0248289 | A1* | 8/2021 | Fasano | G05B 17/02 |
| 2021/0390230 | A1* | 12/2021 | Zou | G06F 30/27 |
| 2022/0083716 | A1* | 3/2022 | Jadhav | G05B 23/0221 |
| 2023/0119842 | A1* | 4/2023 | Gourvenec | B01D 3/4211 |
| | | | | 702/34 |

OTHER PUBLICATIONS

Du, Yuefei—"Design Scheme of Fault Diagnosis System for Rollers of Coal Mills"; 2019 Prognostics and System Health Management Conference (PHM-Paris) (Year: 2019).*

Foszcz et al., "Analysis of process of grinding efficiency in ball and rod mills with various feed parameters," IOP Conf. Series: Materials Science and Engineering, 427 (2018).

* cited by examiner

SYSTEM AND METHOD FOR PERFORMANCE AND HEALTH MONITORING TO OPTIMIZE OPERATION OF A PULVERIZER MILL

PRIORITY CLAIM

This U.S. patent application claims priority under 35 U.S.C. § 119 to: Indian Patent Application No. 202121003172, filed on 22 Jan. 2021. The entire contents of the aforementioned application are incorporated herein by reference.

TECHNICAL FIELD

The disclosure herein generally relates to the field of pulverizers in process industry, and, more particularly, to method and system for performance and health monitoring to optimize operation of pulverizer mills.

BACKGROUND

Pulverizer or pulverizer mills are equipment typically used for crushing or converting the raw materials into fine powdered form to enhance the process efficiency. Coal fired power plants use pulverizers for accomplishing three important tasks—a) grinding of coal into fine particles, b) removal of excess moisture from the coal through hot air, and c) pneumatic transport of coal to the boiler for burning.

Therefore, pulverizers are very critical equipment in overall functioning of a plant such as a thermal power plant. However, pulverizers can become a major bottleneck in smooth operation of the plant, if not functioning optimally. Pulverizers have immense impact on combustion of coal and hence on generation of power, emissions as well as health and safety of the plant. Similarly, overall plant operation and maintenance costs are largely driven by pulverizer downtime. Therefore, sub-optimality and faults occurring in pulverizers are critical parameters that need continuous monitoring.

Major challenges in pulverizers arise due to lack of visibility owing to inability to measure key parameters in real-time. Although pulverizers are controlled by state of the art control systems, there are no real-time measurements of parameters such as outgoing coal fineness and coal moisture, resulting in suboptimal performance and control of the pulverizer. Suboptimal performance results in increased power consumption and reduced throughput. This also may give rise to faults such as pulverizer choking, coal accumulation and pulverizer fire/explosion. In addition to these faults, the moving parts of the pulverizer undergo continuous wear/tear and over a period of time lose their capacity.

Despite advanced control systems, there is a huge dependence on operator expertise and experience to identify and localize such faults and inefficiencies. These faults are difficult to anticipate due to their dependence on past operation, current conditions, fuel/material used as well as environmental conditions. Often these heuristics based decisions are either delayed or are inaccurate leading to huge operational and maintenance loses.

SUMMARY

Embodiments of the present disclosure present technological improvements as solutions to one or more of the above-mentioned technical problems recognized by the inventors in conventional systems. For example, in one embodiment, a system for performance and health monitoring to optimize operation of a pulverizer mill is provided. The system comprises an input/output interface, one or more hardware processors, and a memory. The memory is in communication with the one or more hardware processors, wherein the one or more first hardware processors are configured to execute programmed instructions stored in the one or more first memories, to: receive a plurality of data as input data from one or more data sources; preprocess the plurality of data and storing the preprocessed plurality of data in a database; soft sense a plurality of key performance and health parameters of the pulverizer mill and coal quality parameters using the preprocessed plurality of data and a set of soft sensing models, wherein the set of soft sensing models comprises pre-generated models; predict a plurality of key operating events of the pulverizer mill using the soft sensed plurality of key performance and health parameters, coal quality parameters and the preprocessed plurality of data, wherein the plurality of key operating events are associated with adverse conditions in the pulverizer mill; estimate a current health index and a future health index using a plurality of health index models, wherein the health index is indicative of the health of the pulverizer mill, wherein the plurality of health index models are pre-generated models; compare the current health index and the future health index with a threshold health index, diagnose the current health and future health of the pulverizer mill, wherein the diagnosis comprises of identifying and localization of faults, a root cause analysis of the faults, and estimating a remaining useful life (RUL) of the pulverizer mill and its components; provide a set of operating recommendations to the pulverizer mill to mitigate the adverse conditions in the pulverizer mill based on the plurality of key operating events and the diagnosis; and provide optimal maintenance and scheduling recommendations using maintenance optimizer models, based on the estimated the current health index, the future health index and the estimated remaining useful life of pulverizer mill.

In another aspect, a method for performance and health monitoring to optimize operation of a pulverizer mill is provided. Initially, a plurality of data is received as input data from one or more data sources. The plurality of data is preprocessed, and the preprocessed plurality of data is stored in a database. In the next step, a plurality of key performance and health parameters of the pulverizer mill and coal quality parameters are soft sensed using the preprocessed plurality of data and a set of soft sensing models, wherein the set of soft sensing models comprises pre-generated models. Further, a plurality of key operating events of the pulverizer mill is predicted using the soft sensed plurality of key performance, health parameters, coal quality parameters and the preprocessed plurality of data, wherein the plurality of key operating events are associated with adverse conditions in the pulverizer mill. In the next step, a current health index and a future health index are estimated using a plurality of health index models, wherein the health index is indicative of the health of the pulverizer mill, wherein the plurality of health index models are pre-generated models. The current health index and the future health index are then compared with a threshold health index, diagnose the current health and future health of the pulverizer mill, wherein the diagnosis comprises of identifying and localization of faults, a root cause analysis of the faults, and estimating a remaining useful life (RUL) of the pulverizer mill and its components. In the next step, a set of operating recommendations is provided to the pulverizer mill to mitigate the adverse conditions in the pulverizer mill based on the plurality of key operating events and the diagnosis. And finally, optimal maintenance and scheduling recommendations are provided using maintenance optimizer models, based on the estimated the current health index, the future health index and the estimated remaining useful life of pulverizer mill.

In yet another aspect, one or more non-transitory machine-readable information storage mediums comprising one or more instructions which when executed by one or more hardware processors cause performance and health monitoring to optimize operation of a pulverizer mill. Initially, a plurality of data is received as input data from one or more data sources. The plurality of data is preprocessed, and the preprocessed plurality of data is stored in a database. In the next step, a plurality of key performance and health parameters of the pulverizer mill and coal quality parameters are soft sensed using the preprocessed plurality of data and a set of soft sensing models, wherein the set of soft sensing models comprises pre-generated models. Further, a plurality of key operating events of the pulverizer mill is predicted using the soft sensed plurality of key performance, health parameters, coal quality parameters and the preprocessed plurality of data, wherein the plurality of key operating events are associated with adverse conditions in the pulverizer mill. In the next step, a current health index and a future health index are estimated using a plurality of health index models, wherein the health index is indicative of the health of the pulverizer mill, wherein the plurality of health index models are pre-generated models. The current health index and the future health index are then compared with a threshold health index, diagnose the current health and future health of the pulverizer mill, wherein the diagnosis comprises of identifying and localization of faults, a root cause analysis of the faults, and estimating a remaining useful life (RUL) of the pulverizer mill and its components. In the next step, a set of operating recommendations is provided to the pulverizer mill to mitigate the adverse conditions in the pulverizer mill based on the plurality of key operating events and the diagnosis. And finally, optimal maintenance and scheduling recommendations are provided using maintenance optimizer models, based on the estimated the current health index, the future health index and the estimated remaining useful life of pulverizer mill.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION

Figure 1:
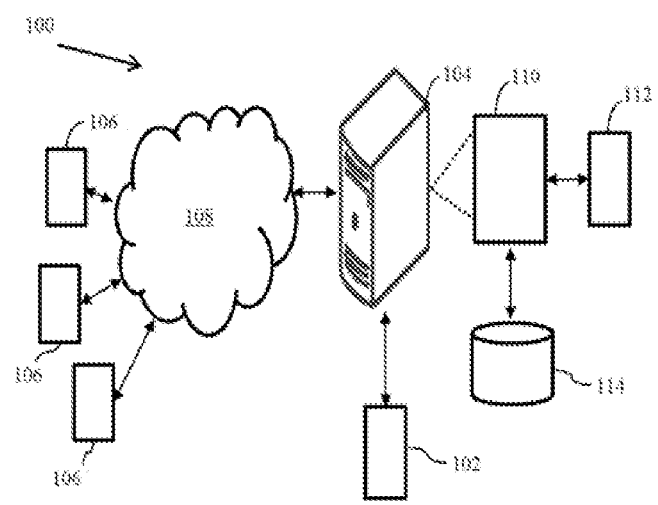
FIG. 1 illustrates a block diagram of a system for performance and health monitoring to optimize operation of pulverizer mills according to some embodiments of the present disclosure.

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the scope of the disclosed embodiments.

Pulverizers are very critical equipment in overall functioning of a plant such as a thermal power plant. Major challenges in pulverizers arise due to lack of visibility owing to inability to measure key parameters in real-time. Although, pulverizer today are controlled by state of the art control systems, there are no real-time measurements of parameters such as outgoing coal fineness and coal moisture, resulting in suboptimal performance and control of the pulverizer. Suboptimal performance results in increased power consumption and reduced throughput. This also may give rise to faults such as pulverizer choking, coal accumulation and pulverizer fire/explosion. In addition to these faults, the moving parts of the pulverizer undergo continuous wear/tear and over a period of time lose their capacity. For example, the table and roller system in pulverizers needs to be replaced periodically. Increased wear and tear also increase the friction and creates problems with lubrication as well.

There are a few control systems present in the art which are used for optimizing the operation of the pulverizer mill. Despite advanced control systems, there is a huge dependence of operator expertise and experience to identify and localize such faults and inefficiencies. These faults are difficult to anticipate due to their dependence on past operation, current conditions, fuel/material used as well as environmental conditions. Often these heuristics based decisions are either delayed or are inaccurate leading to huge operational and maintenance loses. Therefore, there is a need for digital twin solution that can mimic the performance of pulverizer in real-time and assist the operators in decision making related to operation, maintenance and scheduling.

According to an embodiment of the disclosure, a system for performance and health monitoring to optimize operation of a pulverizer or a pulverizer mill is provided. The system comprises a digital twin that can mimic the performance of the pulverizer in real-time and assist the operators in decision making related to operation, maintenance and scheduling. The digital twin is configured to receive real-time sensor data from a plurality of data sources and provides real-time soft sensing of key parameters related to health and performance of the pulverizer. One more key aspect of the solution is the advisory system that alerts and recommends corrective actions in terms of either pulverizer process parameters or parameters controlled through other equipment or changes in operation or design. The system provides estimate for the remaining useful operation life of the pulverizer and suggest the maintenance schedule by considering the ageing characteristics.

Referring now to the drawings, and more particularly to FIG. 1 through FIG. 7B, where similar reference characters denote corresponding features consistently throughout the figures, there are shown preferred embodiments and these embodiments are described in the context of the following exemplary system and/or method.

Figure 2:
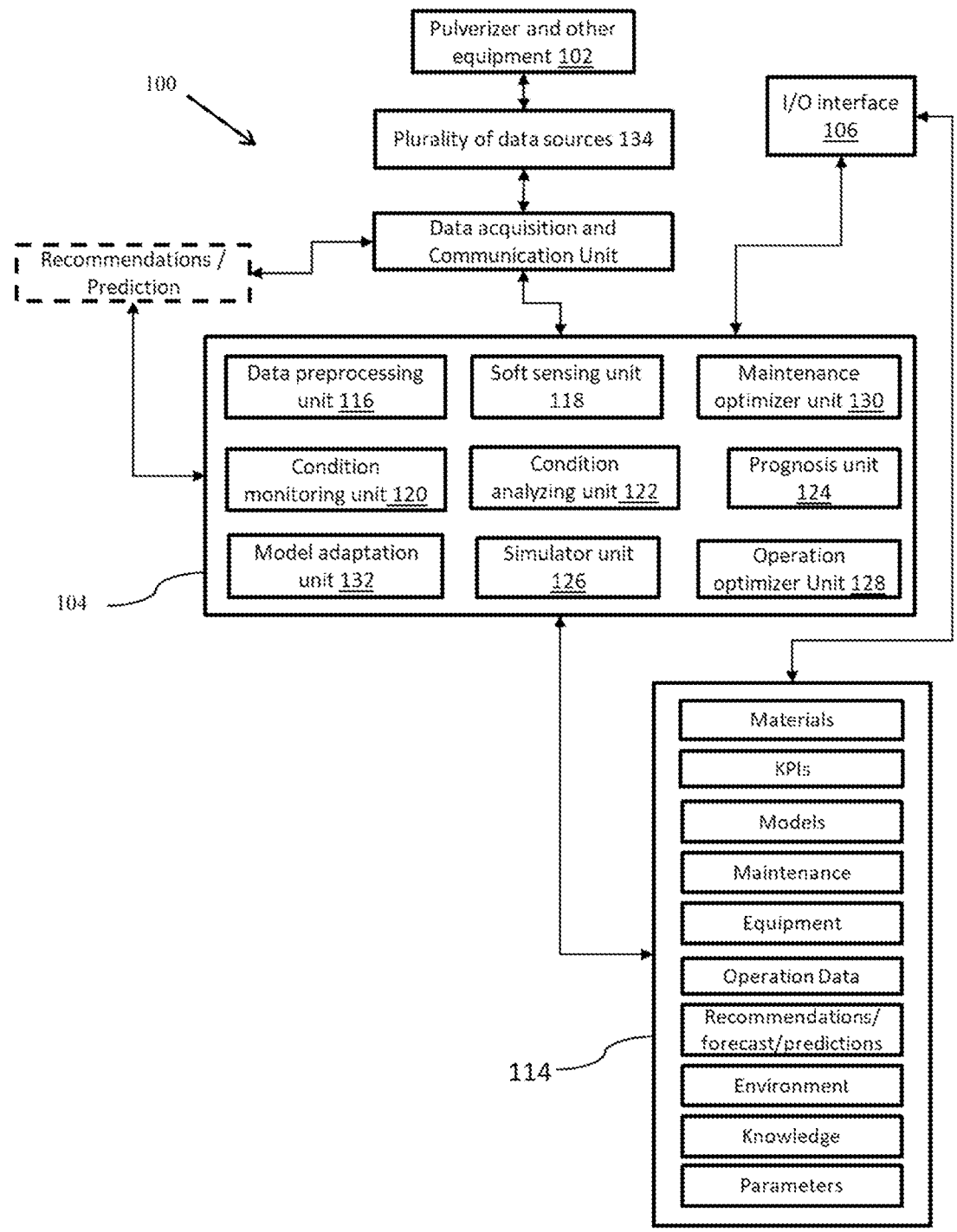
FIG. 2 is a functional block diagram of the system of FIG. 1 for performance and health monitoring to optimize operation of pulverizer mills according to some embodiments of the present disclosure.

According to an embodiment of the disclosure, FIG. 1 illustrates a block diagram and FIG. 2 shows a functional block diagram of a system 100 for performance and health monitoring to optimize operation of a pulverizer 102 or a pulverizing mill 102. The system 100 may also contain more than one pulverizer mills. The system 100 provides a digital twin that can mimic the performance of the pulverizer 102 in real-time and assist the operators in decision making related to operation, maintenance and scheduling. The digital twin utilizes a combination of physics-based modeling, data driven techniques and expert knowledge that provides additional visibility to an operator or user through soft sensors. The system 100 is also configured to real-time monitor and optimize the performance of pulverizer 102. The system 100 results in better maintenance and operational decision making through accurate estimation of remaining useful life of components.

Although the present disclosure is explained considering that the system 100 is implemented on a server, it may also be present elsewhere such as a local machine. It may be understood that the system 100 comprises one or more computing devices 104, such as a laptop computer, a desktop computer, a notebook, a workstation, a cloud-based computing environment and the like. It will be understood that the system 100 may be accessed through one or more input/output interfaces collectively referred to as I/O interface 106. Examples of the I/O interface 106 may include, but are not limited to, a user interface, a portable computer, a personal digital assistant, a handheld device, a smartphone, a tablet computer, a workstation and the like. The I/O interface 106 are communicatively coupled to the system 100 through a network 108.

In an embodiment, the network 108 may be a wireless or a wired network, or a combination thereof. In an example, the network 108 can be implemented as a computer network, as one of the different types of networks, such as virtual private network (VPN), intranet, local area network (LAN), wide area network (WAN), the internet, and such. The network 108 may either be a dedicated network or a shared network, which represents an association of the different types of networks that use a variety of protocols, for example, Hypertext Transfer Protocol (HTTP), Transmission Control Protocol/Internet Protocol (TCP/IP), and Wireless Application Protocol (WAP), to communicate with each other. Further, the network 108 may include a variety of network devices, including routers, bridges, servers, computing devices, storage devices. The network devices within the network 108 may interact with the system 100 through communication links.

The system 100 may be implemented in a workstation, a mainframe computer, a server, and a network server. In an embodiment, the computing device 104 further comprises one or more hardware processors 110, one or more memory 112, hereinafter referred as a memory 112 and a data repository 114, for example, a repository 114 or a database 114. The memory 112 is in communication with the one or more hardware processors 110, wherein the one or more hardware processors 110 are configured to execute programmed instructions stored in the memory 112, to perform various functions as explained in the later part of the disclosure. The repository 114 may store data processed, received, and generated by the system 100.

The system 100 supports various connectivity options such as BLUETOOTH®, USB, ZigBee and other cellular services. The network environment enables connection of various components of the system 100 using any communication link including Internet, WAN, MAN, and so on. In an exemplary embodiment, the system 100 is implemented to operate as a stand-alone device. In another embodiment, the system 100 may be implemented to work as a loosely coupled device to a smart computing environment. The components and functionalities of the system 100 are described further in detail.

According to an embodiment of the disclosure, the system 100 further comprises the database 114, that stores variety of data and information that can be appended, used or deleted. The material related information stored in the database 114 comprises information related to coal usage, demand, storage, inventory, costs. The KPIs related information comprises of key metrics such as throughput, emissions, safety, availability, operation costs, maintenance costs of the plant and the pulverizer mill. The pre-built models and all the model parameters in all the modules of the system are stored in the database 114. The database 114 also holds the information related to maintenance, design of the pulverize mill and other equipment. The raw, processed and predicted data from different sources and models is stored in the database 114. The database 114 also stores the environmental information as well as the decisions/outcomes/recommendations from the different models used. The database 114 may also hold some expert knowledge in form of rules (such as FMEA) for use in the decision making process.

According to an embodiment of the disclosure, the memory 112 further comprises a plurality of units or plurality of modules. The plurality of units is configured to perform various functions. The plurality of units comprises a data preprocessing unit 116, a soft sensing unit 118, a condition monitoring unit 120, a condition analyzing unit 122, a prognosis unit 124, a simulator unit 126, an operation optimizer unit 128, a maintenance optimizer unit 130, and a model adaptation unit 132.

According to an embodiment of the disclosure, an input data is collected from a plurality of data sources 134. The plurality of data sources 134 comprises one or more of comprises a distributed control system (DCS), one or more of Supervisory Control and Data Acquisition (SCADA) System, Enterprise Resource Planning (ERP) system, a historian, a laboratory information management system (LIMS), Manufacturing Execution System (MES), Manufacturing Operations Management System (MOM), databases, a plurality of sensors, external sources, manual input and other digital systems in the process plant. The data can also be entered manually by the user/operator using the I/O interface 106. The data can also be collected from a plurality of sensors and instruments installed for sensing specific operating conditions.

According to an embodiment of the disclosure, the system 100 comprises the data preprocessing unit 116. The data preprocessing unit 116 is configured to receive data from various sources and preprocess it as per the requirement and store the preprocessed data in the data repository 114. The transformation of data comprises identification and removal of outliers, imputation of missing data, and synchronization and integration of a plurality of variables from one or more data sources using the residence time of all the units of the pulverizer 102. The sampling frequency of real-time and non-real-time data may be unified to, for example, once every 1 min, where the real-time data is sampled as necessary, and the non-real-time data is interpolated or replicated as necessary. Additional data transformation required for specific units can also be performed.

According to an embodiment of the disclosure the system 100 comprises the soft sensing unit 118. The soft sensing unit 118 is configured to soft sense a plurality of key performance and health parameters of the pulverizer mill and coal quality parameters using the preprocessed plurality of data and a set of soft sensing models, wherein the set of soft sensing models are pre-generated models stored in the database 114. The health parameters may comprise of grinding effectiveness index as an example. The performance parameters comprise of outgoing coal fineness, internal coal accumulation, outgoing coal flow, mill current, mill differential pressure and coal moisture. The coal quality parameters may comprise of coal calorific value, coal hardness, coal incoming moisture as these measurements are not available online.

Figure 3:
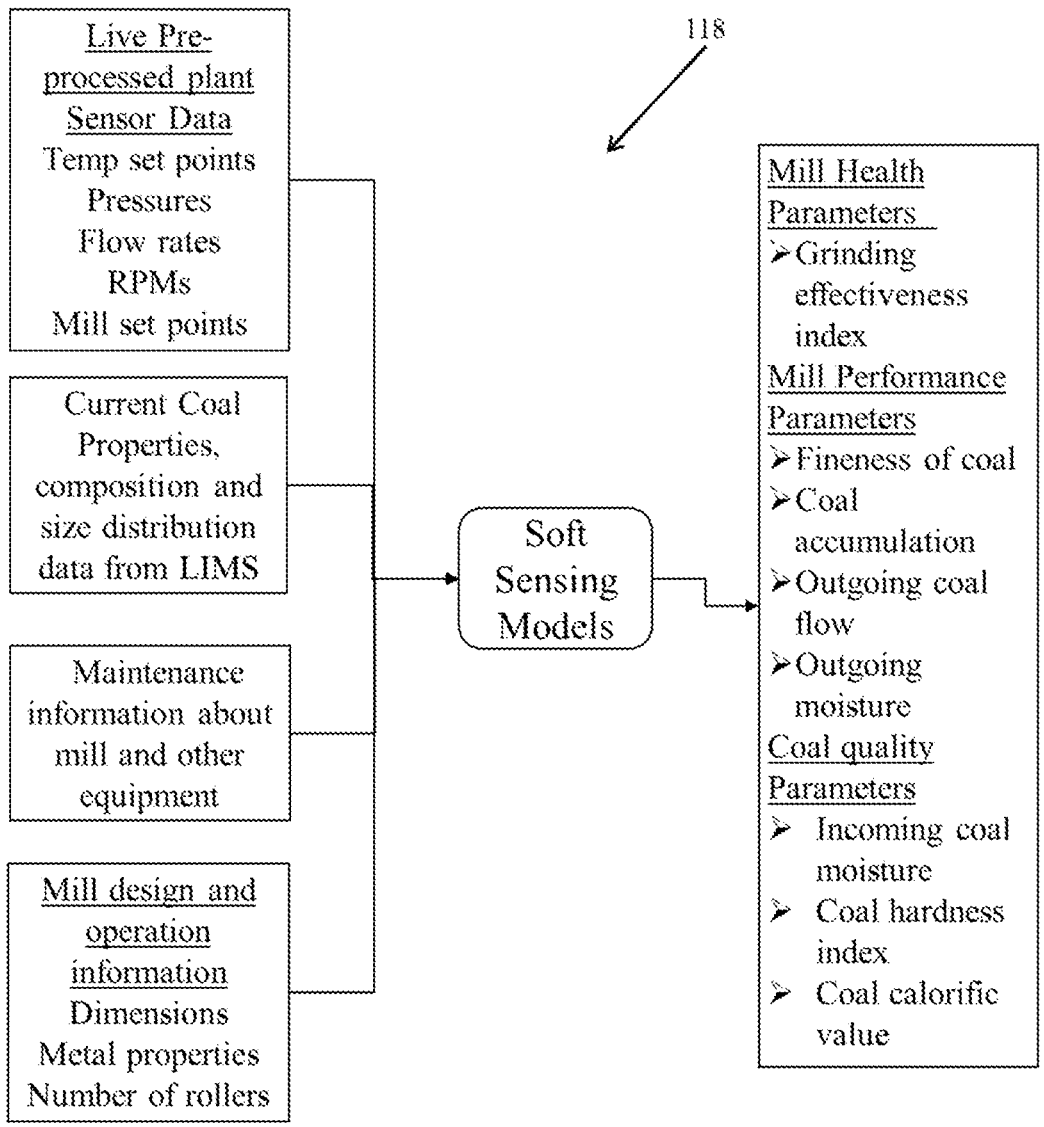
FIG. 3 is block diagram of soft sensing models used in the system of FIG. 1 according to some embodiments of the present disclosure.

A schematic block diagram of the soft sensing models in the soft sensing unit 118 is shown in FIG. 3. The soft sensing unit 118 comprises the set of soft sensing models utilizing the current preprocessed data from variety of sensors installed on the mill and upstream-downstream equipment. For instance, the first input is the pre-processed data comprising of temperatures, flow rates, pressures, RPMs and control system set-points for the mill. The second input to the set of soft sensing models is the data from laboratory information management system (LIMS) that comprises of periodic coal quality measurements (coal composition, calorific value, hardness index, moisture, coal size distribution at inlet and outlet of mill). Third input comprises of maintenance related information that may include previous maintenance history of the mill. The soft sensing models may also utilize the design and mill specific information such as dimensions, properties of mill material, number of rollers and so on.

As an embodiment, the set of soft sensing models comprise of a physics-based model of the mill coupled with an optimizer that enables prediction of mill health parameters such as grinding effectiveness in real time. For instance, the physics-based model may solve a set of differential and algebraic equations representing the transport, drying and grinding of coal within different zones of mill. The coal size distribution could be represented by a set of different sized bins. The grinding effectiveness can be captured by a set of coal grinding matrix that represents the fraction of coal moving from a coarser bin to the next finer bin over a length of time. This coal grinding matrix also represents the grinding effectiveness and plays a key role in predicting mill current and the mill differential pressure.

The set of soft sensing model use the underlying physics-based model for real-time determination of grinding effectiveness by optimizing it value such that the predicted outputs (comprising of mill current, mill outlet moisture, coal flow rate, outgoing coal size distribution) match the real measurements in the plant (comprising of measurements recorded in DCS and LIMS). Some measurements such as that of coal size distribution at the inlet and outlet of mill could be measured periodically and used for correcting the grinding effectiveness index predictions from the model. Once the grinding effectiveness of the mill is established, the soft sensing models are then used for predicting key health and performance parameters of the mill mentioned above.

Alternatively, the physics-based model in the soft sensing unit 118 could be replaced or supplemented by a data-drive model (such as a neural network or machine learning based model).

According to an embodiment of the disclosure, the set of physics-based models in the soft sensing models may be preceded by a data-driven models (such as machine learning regression, Kalman filter, clustering, classification) that can soft sense the quality of incoming coal in real-time. Alternatively, the coal quality parameter prediction models may comprise of classification or regression type of models. The predictions may comprise of real-time estimation of coal hardness, coal calorific value, coal incoming moisture. These predictions can then be used in the following physics-based model in the soft sensing models to predict health and performance parameters of the mill.

Figure 4:
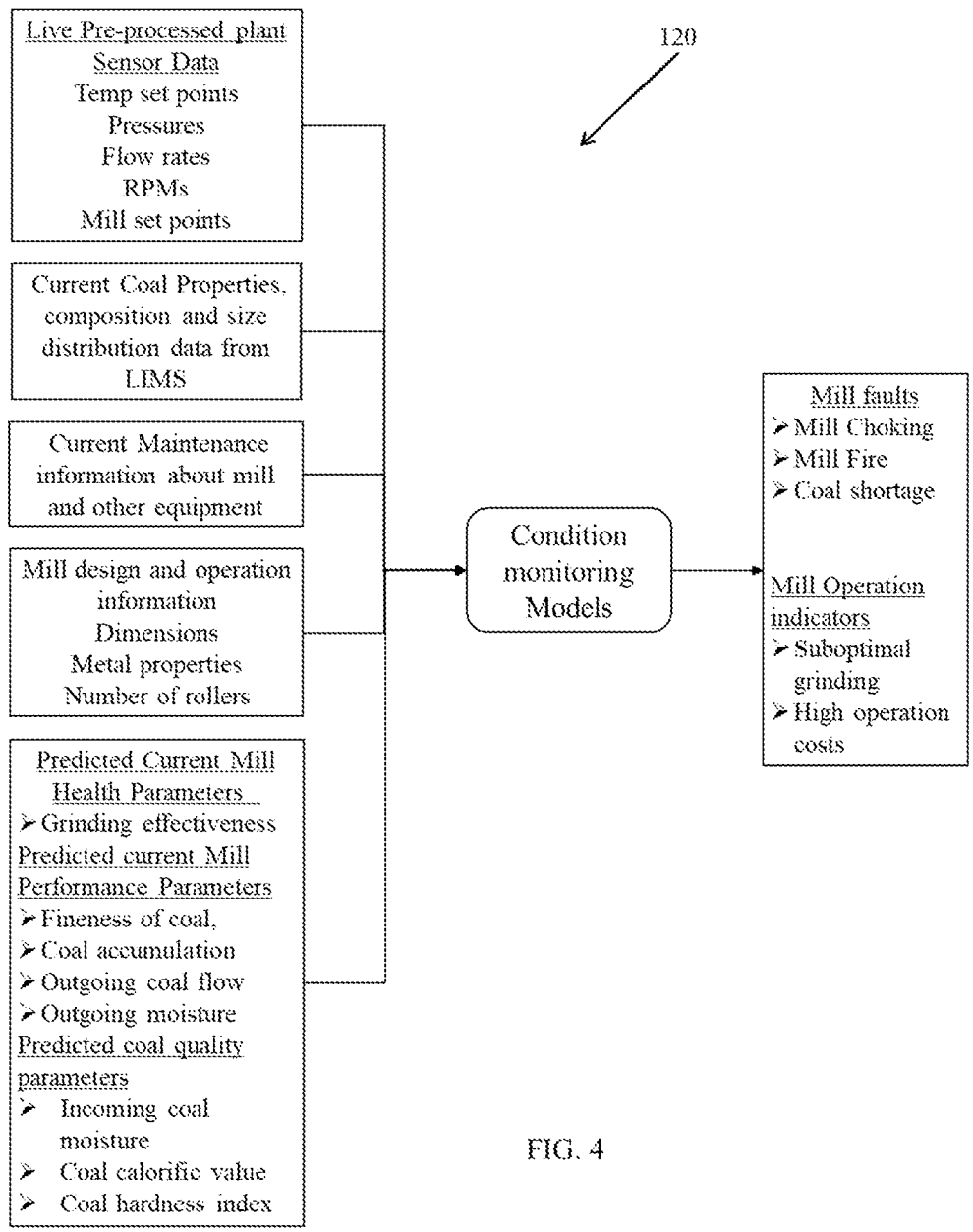
FIG. 4 is a block diagram of condition monitoring models used in the system of FIG. 1 according to some embodiments of the present disclosure.

According to an embodiment of the disclosure the system 100 comprises the condition monitoring unit 120. A block diagram of the condition monitoring models in the condition monitoring unit 120 is shown in FIG. 4. The condition monitoring unit 120 configured to predict a plurality of key operating events of the pulverizer mill 102 using the soft sensed plurality of key performance and health parameters, soft sensed coal quality parameters and the preprocessed plurality of data. The plurality of key operating events associated with adverse conditions in the pulverizer mill. The key operating events comprise events such as high operation cost, operating regime shift, coal property variations, component degradation, safety risks (such as fire) and environmental risks pertaining to pulverizer operation, using a plurality of condition monitoring models present in the condition monitoring unit 120. The plurality of condition monitoring models could be component level (model of grinding or classifier component), equipment level (model for pulverizer 1, pulverizer 2) and even plant level (model for pulverizers, boilers and other equipment combined). The plurality of condition monitoring models may comprise of a combination of data-driven algorithms, physics-based models and expert knowledge.

The plurality of key operating events may also comprise of monitoring operating regime changes and fuel quality changes. Safety risks may comprise of monitoring temperatures within the pulverizer 102 given the properties of coal being processed. Performance monitoring comprises of monitoring key performance indicators of operating cost, efficiency, productivity, throughput, product quality. Equipment degradation monitoring may comprise of monitoring indicators of roller, table, gearbox degradation such as vibrations and current. Environmental factor monitoring may comprise of monitoring impact of pulverizer operation on emissions such as NOx, SOx, CO and others. Fault monitoring may comprise of checking for faults such as choking, hang up, fire, roller wear, table wear, lubrication failure, gearbox failure among others.

The plurality of condition monitoring models makes use of data-driven models, physics-based models, expert knowledge based rules and algorithms to monitor the pulverizer 102 and its components. The plurality of condition monitoring models use the pre-processed sensor data, maintenance information, information from LIMS, mill design and mill specific information and predicted, performance and coal quality parameters from the set of soft sensing models.

As an example, the plurality of condition monitoring models may observe the trends in coal accumulated (soft sensed by soft sensing models) in each zone of mill over time and raise an alarm if there is a shift in in the accumulated coal trends. These rules and thresholds could be based on the operator or expert knowledge. It is important to remember that there is no real time measurement of coal accumulated in the mill. Similarly, the plurality of condition monitoring models could monitor the trends in grinding effectiveness index of the mill soft sensed by the soft sensing models. The plurality of condition monitoring models may alert the operator on sub-optimal operation by tracking the specific power consumption of the mill for a given coal category. The plurality of condition monitoring models could be learnt based on past historical data of the mill for identifying the right threshold of sub-optimal operation.

According to an embodiment of the disclosure the system 100 comprises the condition analyzing unit 122. The condition analyzing unit 122 is configured to estimate a current health index and a future health index using a plurality of health index models. Health index is indicative of the health of the pulverizer mill 102, wherein the plurality of health index models are pre-generated models. The plurality of health index models may comprise of a combination of data-driven algorithms, physics-based models and expert knowledge.

The health index provides indication of suboptimal operation, deterioration of components and possible faults and anomalies, despite variations in upstream-downstream conditions, ambient conditions, coal property variations and operating regime changes. The health index could be a number or a set of numbers, which is a function of measured parameters, soft sensed parameters, coal properties as well as maintenance and design data. The measure parameters may include motor current, coal flow rate, air flow rate, hydraulic oil pressure, roller gap, bowl differential pressure, lubricating oil temperature, vibrations, classifier RPM, various set points from control system, inlet-outlet air temperature, various pressures among others. Coal properties may comprise of hardness index, calorific value and ultimate and proximate analysis of coal. The maintenance and design data may comprise of pulverizer and plant historical record of maintenance, dimensional and design specific information of pulverizer and plant. The health index may be calculated as a combination of physics-driven models, data-driven approach and expert knowledge.

Figure 5:
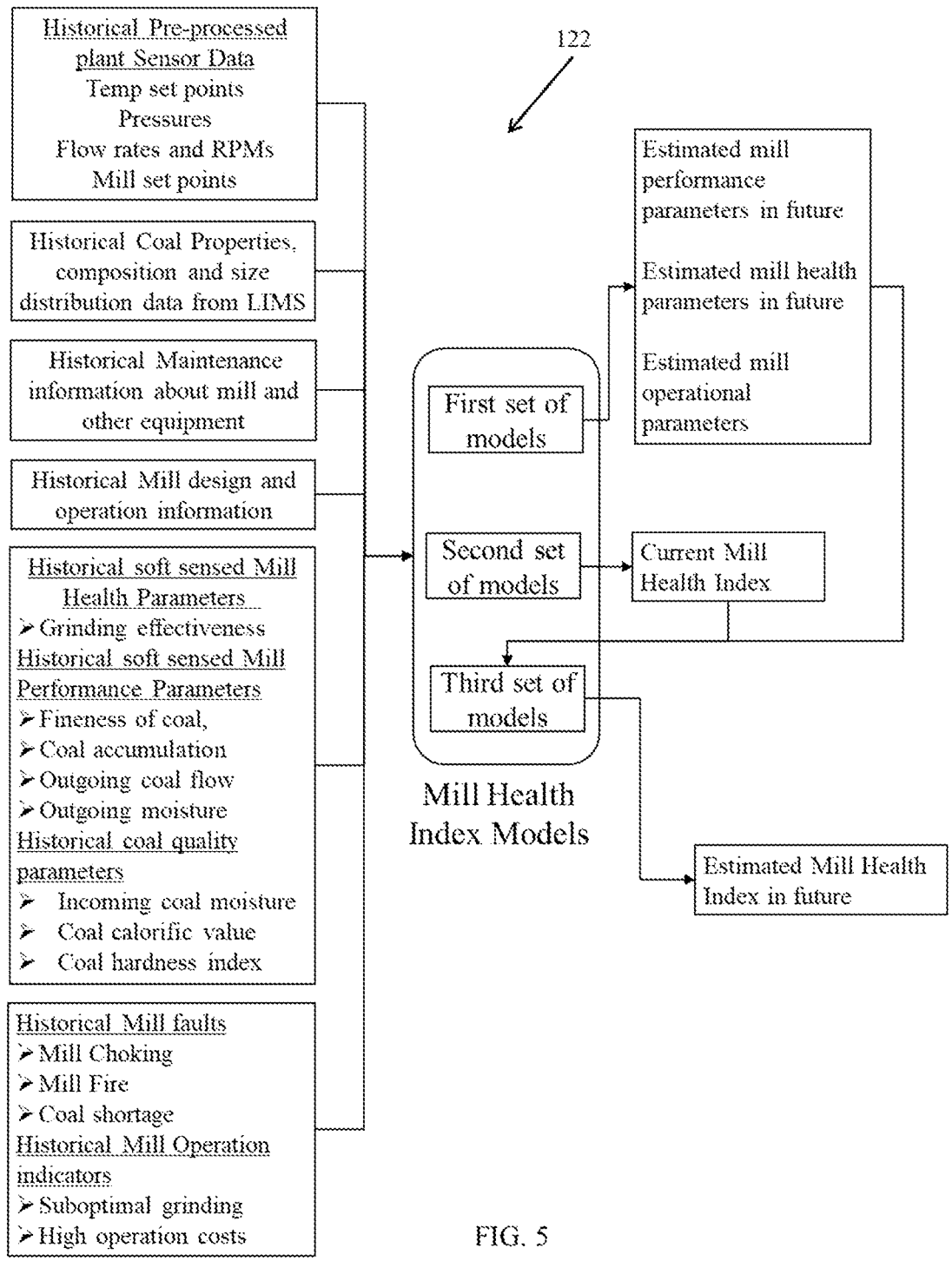
FIG. 5 is a block diagram of mill health index models used in the system of FIG. 1 according to some embodiments of the present disclosure.

As shown in the block diagram of FIG. 5, the plurality of health index models utilizes diverse sets of historical and current data of the plant. The first input comprises of historical preprocessed sensor data coming from the pulverizer 102. The second input comprises of historical records from LIMS such as coal types, coal quality and coal size distribution done periodically. The third input comprises of maintenance information regarding the mill such as records of roller changes, maintenance of other parts of mill, faults observed and so on. The fourth input comprises of mill design and mill specific information. The fifth input is the soft sensed mill health, mill performance and coal quality related parameters predicted on the historical records of the mill. The outputs from the condition monitoring unit 122 could also be used for feeding into the plurality of health index models. The plurality of health index models may predict the current value of the health index as well as forecast the future trends in health index using the historical trends.

Figure 6:
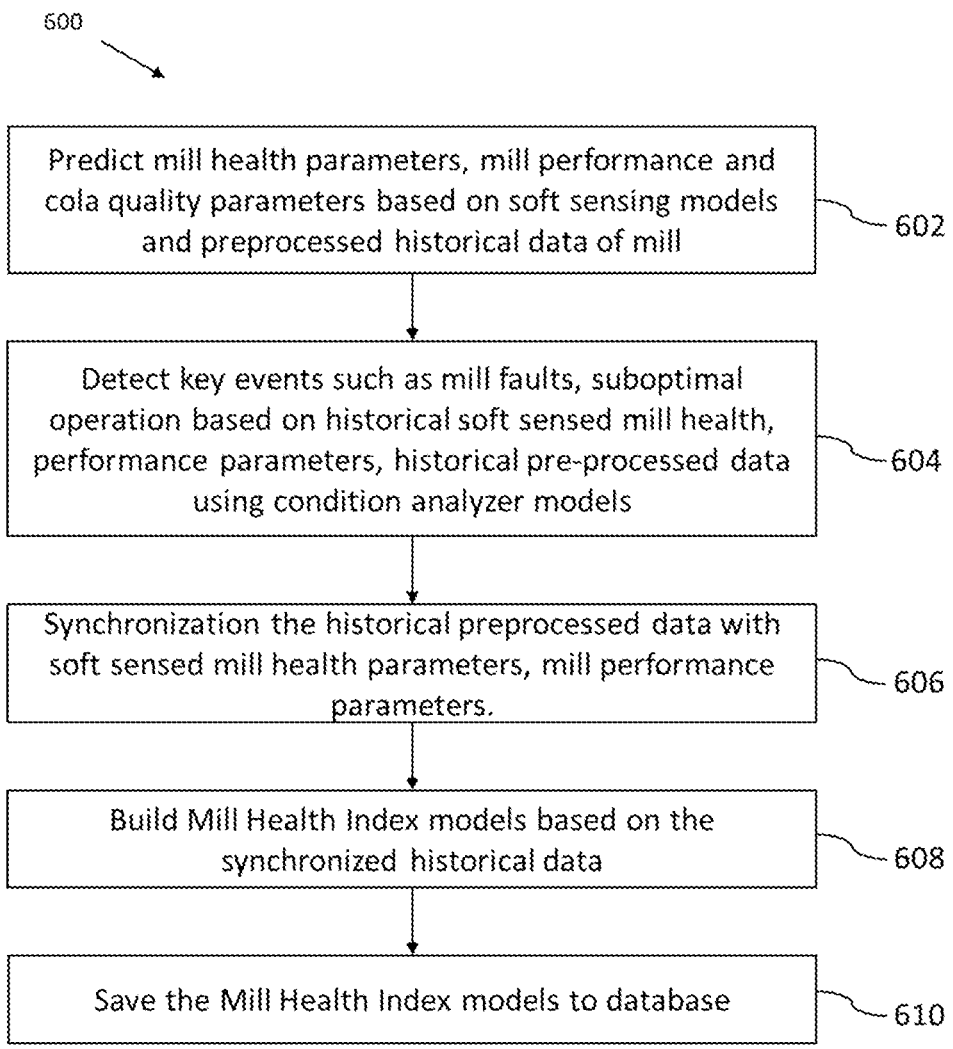
FIG. 6 is a flow diagram illustrating the steps involved in the generation of the plurality of health index models according to some embodiments of the present disclosure.

According to an embodiment of the disclosure, a flow diagram (600) for generating the plurality of health index model is shown in FIG. 6. At step 602, the set of soft sensing models are used for predicting the mill health, mill performance and coal quality parameters on the historically stored data pertaining to the pulverizer 102. At step 604, the plurality of condition monitoring models is used to predict and detect the key operating events based on the historical pre-processed data and the soft sensed health, performance and coal quality parameters. At step 606, the data from different sources and models is synchronized. For example, although the sensor data may come at every second or minute, the LIMS measurements and maintenance information could only be available once an hour or one a day. The predictions from set of soft sensing and the plurality of condition monitoring models may also vary accordingly. This data from different sources, models and at different frequencies is automatically synchronized. At step 608, the plurality of health index models is built using the synchronized data. At step 610, the mill health index models are saved in the database.

The plurality of health index models could be a combination of physics-based models, data-driven model and expert knowledge. In an embodiment of the present disclosure, the plurality of health index models could be a set of supervised, unsupervised or semi-supervised deep learning models. The plurality of health index models may comprise three set of mill health index models as shown in FIG. 5. A first set of mill health index models may comprise of supervised forecasting models (using techniques such as ARIMA, LSTM and so on) that predict the future trends in the mill sensor data as well as the earlier predicted mill health and performance parameters. The forecast horizon could be of the order of few days to few months depending on the need. Some of the models in first set of mill health index models could also be derived based on knowledge or planned activities of the plant. For example, data pertaining to future coal quality could be obtained based on coal types available or planned to be purchased. Similarly planned maintenance information could also be utilized.

A second set of mil health index models is used to predict the current health index. The health index is a single number (typically ranging between zero and one) that indicates how the current functioning of the mill is. The second set of mill health index models may comprise of unsupervised or semi-supervised deep learning models (such as LSTM encoder decoder, one class SVM, Principal component-based reconstruction) that utilize all the historical and current set of data from different sources. The labeling of historical data could be done based on outcomes of the plurality of condition monitoring models that annotate key events, defects and faults or suboptimal operations in the pulverizer 102.

A third set mill health index models predict the future trends in health index using the predictions from first and second set of mill health index models as well as the historical data from other sources, as shown in FIG. 5. The third set of mill health index models may be built using time series machine learning/deep learning models such as LSTM, ARIMA regression. They use the estimated future trends in health, performance and operational (sensor data as an example) parameters to predict the future trend in the health index. In another embodiment, different third set of mill health index models are built for each mill and different conditions in the pulverizer 102. A different model could be used for prediction depending upon lifespan of each roller or variety of coals used.

The most unique aspect of the plurality of health index models is the use of soft-sensed health and performance parameters of the pulverizer 102, which are typically not measured online. The use of these parameters enables the future estimates to be consistent with the physics of the process compared to simply using the sensor data and its history. In addition, due to use of physics-based soft sensing, the health index itself becomes interpretable to an operator.

According to an embodiment of the disclosure the system 100 comprises the prognosis unit 124. The prognosis unit 124 is configured to compare the current health index and the future health index with a threshold health index to diagnose the current health and future health of the pulverizer mill 102. The diagnosis comprises of identifying and localization of faults, a root cause analysis of the faults, and estimating a remaining useful life (RUL) of the pulverizer mill and its components. In an embodiment, the prognosis unit 124 may identify the top 5 or top 10 parameters responsible for anomaly or shift in health index pattern. The prognosis unit 124 may also identify whether it is a suboptimal performance issue or an equipment/component wear. Alternatively, it may also comprise of a domain knowledge-based root cause analysis tree such as Failure Mode Analysis matrix that can be appended based on insights and utilized. The prognosis unit 124 also provides, the remaining useful life of components such as roller, classifier etc., equipment (entire pulverizer) or system of equipment (set of interconnected pulverizers/boilers). This is achieved based on processing the output from third set of models in the condition analyzer unit 122 with a threshold health index, learnt based on past historical data of the mill.

According to an embodiment of the disclosure the system 100 comprises the operation optimizer unit 128. The operation optimizer unit 128 is configured to provide a set of operating recommendations to the pulverizer mill 102 to mitigate the adverse conditions in the pulverizer mill 102 based on the plurality of key operating events and the diagnosis. The set of operating recommendations are provided based on the current and the future performance and health conditions for optimizing fineness of coal, throughput, energy consumption, emissions, health and safety of the pulverizer and its components. For example, the recommendation may comprise of modifying air fuel ratio, outlet air temperature set point, journal hydraulic pressure or roller lift depending upon the incoming coal quality, boiler requirements for optimizing one of the above-mentioned parameters. The operation optimizer unit 128 may utilize one or combination of different models from other units as well as a set of optimization models built and stored in the database.

According to an embodiment of the disclosure the system 100 comprises the maintenance optimizer unit 130. The maintenance optimizer unit 130 is configured to provide optimal maintenance and scheduling recommendations using maintenance optimizer models, based on the estimated the current health index, the future health index and the estimated remaining useful life of pulverizer mill. The maintenance optimizer unit 130 provides maintenance advisory, alarms, warnings and scheduling recommendations for individual components of the pulverizer 102 or the set of pulverizer based on the estimated future health index of pulverizer 102 and its components. For example, the remaining useful life estimation of pulverizer roller from the prognosis unit 124 is utilized for identifying optimum maintenance scheduling time for the roller. The optimization takes into account the parameters comprising of costs, plant level schedule of maintenance and other equipment. In addition, the system 100 may also advise deployment of additional sensors at appropriate locations for increasing accuracy of predictions and effectiveness of recommendations. The maintenance optimizer unit 130 may comprise of scheduler models, multi-objective optimization models pre-built and stored in the database.

According to an embodiment of the disclosure the system 100 also comprises the model adaptation unit 132. Each of the above units comprise of specific predictive models to carry out the intended tasks. This unit assists in calibrating existing models for preprocessing, monitoring, analyzing, prognosis and optimization to adapt better to the current performance and requirements of the pulverizer 102 and plant. This may also comprise of tools for adapting a model built for a specific pulverizer to another pulverizer in the plant or in other plant. Insights, knowledge and relationships learnt from models of pulverizer one could be utilized for initiating and building model for another pulverizer with appropriate adjustment of model parameters and inputs.

According to an embodiment of the disclosure the system 100 comprises the simulator unit 126. The simulator unit 126 is configured to simulate and understand the impact of 'what if' and 'if-what' scenarios for pulverizers. For example, plant operator can use any of the predictive models in any of the modules for simulating what-if scenarios in real-time. This could be used for identifying right set of actions for improving health of the pulverizer/s.

Figure 7A:
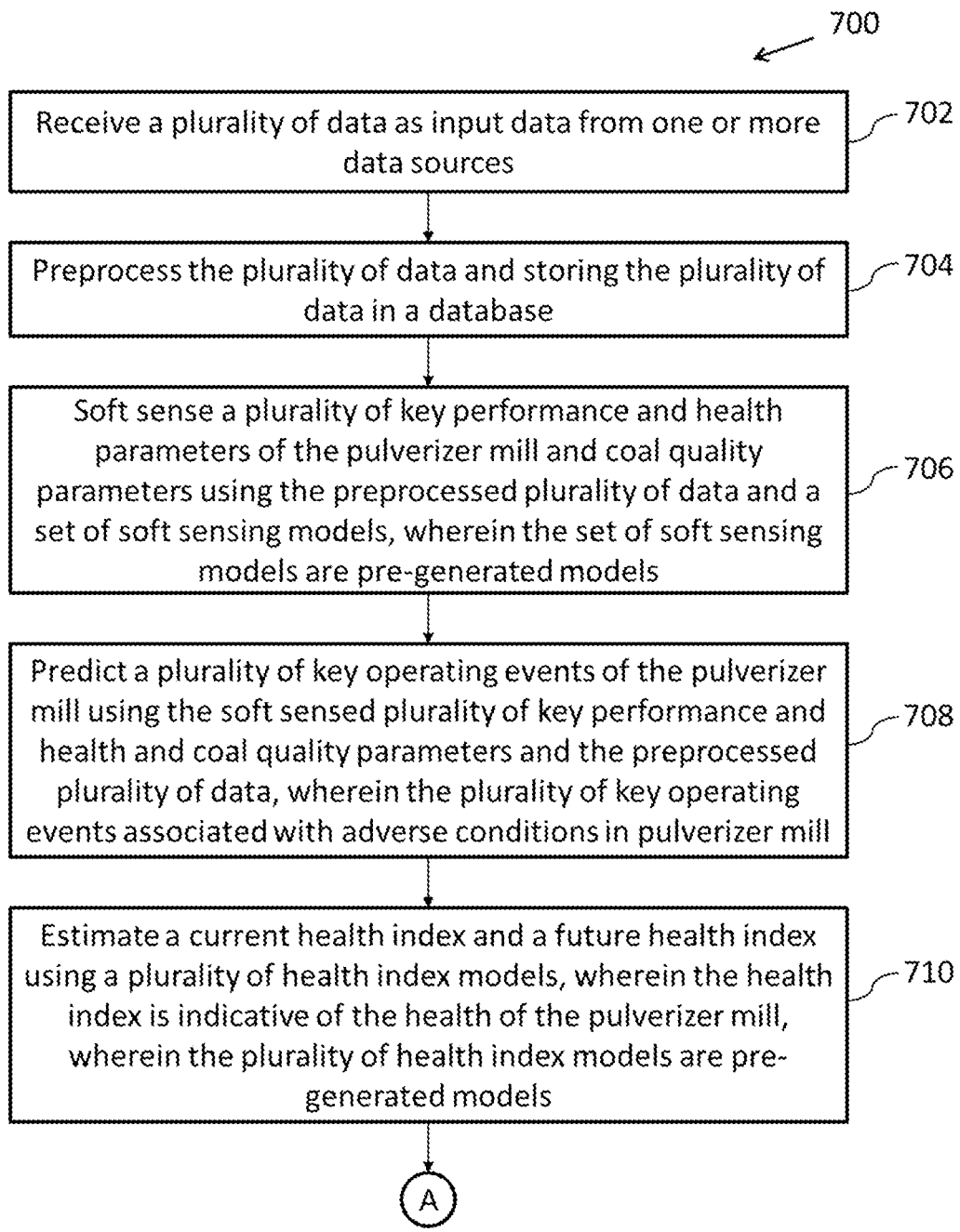
FIGS. 7A and 7B is a flow diagram illustrating method for performance and health monitoring to optimize operation of pulverizer mills in accordance with some embodiments of the present disclosure.
Figure 7B:
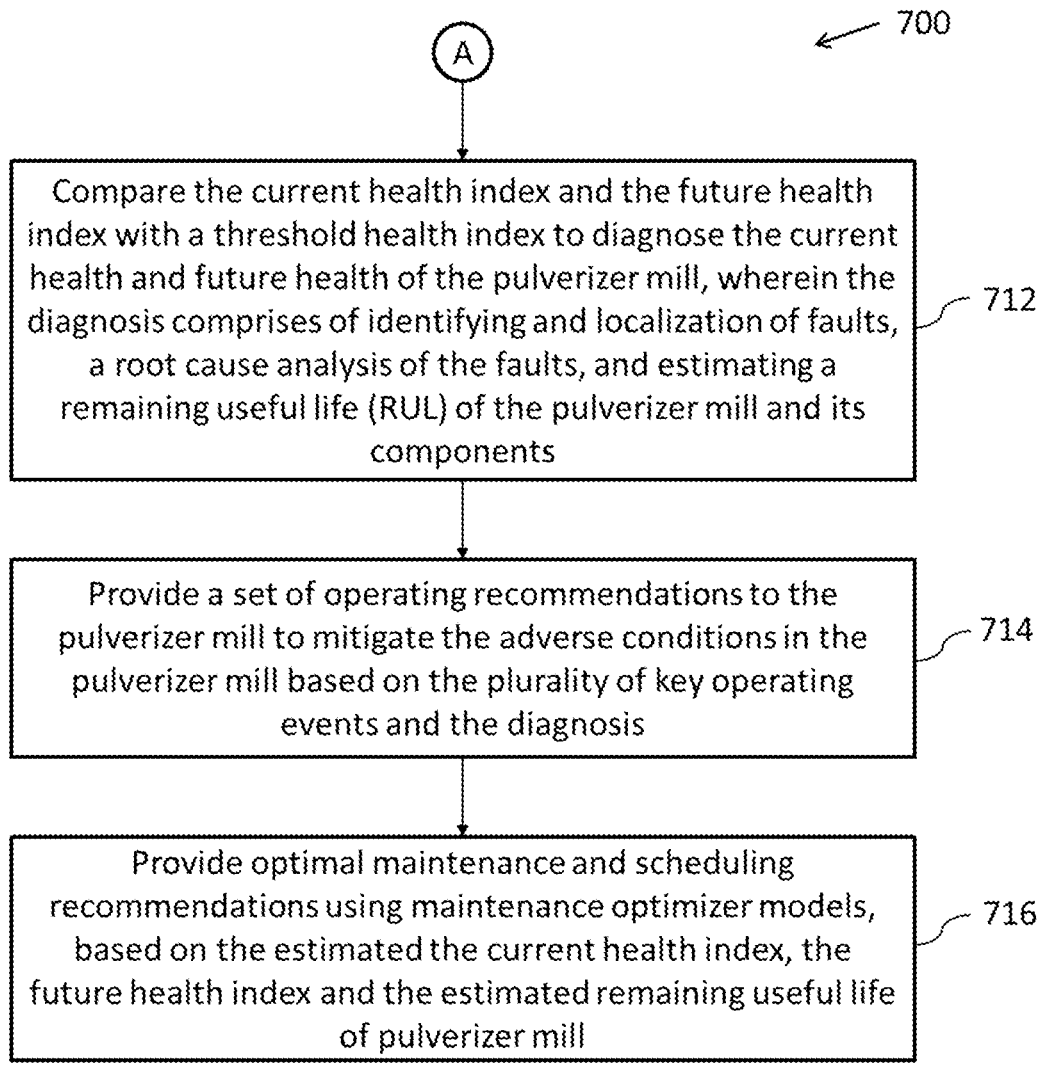

In operation, referring to FIG. 7A-7B, flow diagram of a method 700 for performance and health monitoring to optimize operation of the pulverizer mill 102, is described in accordance with an example embodiment. The method 700 depicted in the flow chart may be executed by a system, for example, the system, 100 of FIG. 1. In an example embodiment, the system 100 may be embodied in the computing device as explained above.

Operations of the flowchart, and combinations of operation in the flowchart, may be implemented by various means, such as hardware, firmware, processor, circuitry and/or other device associated with execution of software including one or more computer program instructions. For example, one or more of the procedures described in various embodiments may be embodied by computer program instructions. In an example embodiment, the computer program instructions, which embody the procedures, described in various embodiments may be stored by at least one memory device of a system and executed by at least one processor in the system. Any such computer program instructions may be loaded onto a computer or other programmable system (for example, hardware) to produce a machine, such that the resulting computer or other programmable system embody means for implementing the operations specified in the flowchart. It will be noted herein that the operations of the method 700 are described with help of system 100. However, the operations of the method 700 can be described and/or practiced by using any other system.

Initially at step 702 of the method 700, the plurality of data is received as input data from one or more data sources. In the next step 704, the plurality of data is preprocessed and stored in the data repository 114. Further at step 706 of the method 700, the plurality of key performance and health parameters of the pulverizer mill 102 are soft-sensed using the preprocessed plurality of data and the set of soft sensing models, wherein the set of soft sensing models are pre-generated models.

At step 708 of the method 700, the plurality of key operating events of the pulverizer mill 102 is predicted using the soft sensed plurality of key performance, health and coal quality parameters and the preprocessed plurality of data, wherein the plurality of key operating events associated with adverse conditions in the pulverizer mill 102.

At step 710 of the method 700, the current health index and the future health index is estimated using the plurality of health index models, wherein the health index is indicative of the health of the pulverizer mill, wherein the plurality of health index models are pre-generated models. Further at step 712, the current health index and the future health index is compared with the threshold health index and diagnose the current health and future health of the pulverizer mill 102, wherein the diagnosis comprises of identifying and localization of faults, a root cause analysis of the faults, and estimating a remaining useful life (RUL) of the pulverizer mill 102 and its components.

Further at step 714 of the method 700, the set of operating recommendations is provided to the pulverizer mill 102 to mitigate the adverse conditions in the pulverizer mill 102 based on the plurality of key operating events and the diagnosis. And finally, at step 716, optimal maintenance and scheduling recommendations are provided using maintenance optimizer models, based on the estimated the current health index, the future health index and the estimated remaining useful life of the pulverizer mill.

According to an embodiment of the disclosure, all the units can work in online or offline mode as per the requirement. Some units may operate online in the background or some may work online in real-time. This system 100 can be applied to pulverizers 102 in power plant as well as any other pulverizers/mills used in other process industry. They may also include optimization solvers and reinforcement learning techniques for optimal control. The models could in turn interface with external models/tools, may receive inputs/outputs and may iterate over them. All units are supported by an interactive user interface that can be used to provide external inputs, receive outputs/recommendations, visualizations of analytics.

According to an embodiment of the disclosure, additional instruments or measurements (online and offline) could be introduced to facilitate the real-time operation of digital twin. For example, a periodic measurement of outgoing coal flow rate and the size of distribution of coal (incoming and outgoing from mill) can be added as a regular procedure. These measurements can then be used by soft sensing, condition monitoring and condition analyzer models for more accurate predictions, estimations and recommendations. A permanent or temporary sensor my also be added on the mill (or upstream and downstream) to measure temperature, flow rates, pressures, concentrations.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

The embodiments of present disclosure herein address unresolved problem of continuous optimization and maintenance of the pulverizer mills. The embodiment, thus provides a method and system for performance and health monitoring to optimize operation of the pulverizer mill It is to be understood that the scope of the protection is extended to such a program and in addition to a computer-readable means having a message therein; such computer-readable storage means contain program-code means for implementation of one or more steps of the method, when the program runs on a server or mobile device or any suitable programmable device. The hardware device can be any kind of device which can be programmed including e.g. any kind of computer like a server or a personal computer, or the like, or any combination thereof. The device may also include means which could be e.g. hardware means like e.g. an application-specific integrated circuit (ASIC), a field-programmable gate array (FPGA), or a combination of hardware and software means, e.g. an ASIC and an FPGA, or at least one microprocessor and at least one memory with software processing components located therein. Thus, the means can include both hardware means and software means. The method embodiments described herein could be implemented in hardware and software. The device may also include software means. Alternatively, the embodiments may be implemented on different hardware devices, e.g. using a plurality of CPUs.

The embodiments herein can comprise hardware and software elements. The embodiments that are implemented in software include but are not limited to firmware, resident software, microcode, etc. The functions performed by various components described herein may be implemented in other components or combinations of other components. For the purposes of this description, a computer-usable or computer readable medium can be any apparatus that can comprise, store, communicate, propagate, or transport the program for use by or in connection with the instruction execution system, apparatus, or device.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope of disclosed embodiments being indicated by the following claims.

What is claimed is:

1. A processor implemented method for performance and health monitoring to optimize operation of a pulverizer mill, the method comprising:
   receiving, via one or more hardware processors, a plurality of data as input data from one or more data sources, wherein the plurality of data comprises:
      a plurality of current and historical measurements by a plurality of sensors installed on the pulverizer mill and upstream-downstream equipment, comprising of flow rates, pressures, temperatures, concentrations and control system set points;
      a plurality of current and historical coal properties data comprising of a hardness index, a calorific value and an ultimate and proximate analysis of coal; and
      a maintenance and design data comprising of the pulverizer mill and, historical record of maintenance, dimensional and design specific information of the pulverizer mill;
   preprocessing, via the one or more hardware processors, the plurality of data and storing the preprocessed plurality of data in a database, wherein the pre-processing further comprises:
      identification and removal of outliers from the plurality of data;
      imputation of missing data from the plurality of data; and
      synchronization and integration of a plurality of variables from the one or more data sources using the residence time of a plurality of units of the pulverizer;
   soft sensing in real time, via the one or more hardware processors, a plurality of key performance and health parameters of the pulverizer mill and coal quality parameters using the preprocessed plurality of data and a set of soft sensing models,
   wherein the set of soft sensing models comprises a set of physics-based models for real-time determination of grinding effectiveness preceded by data-driven models, wherein the set of physics-based models solve a set of differential and algebraic equations representing transport, drying and grinding of coal within different zones of the pulverizer mill, and wherein the grinding effectiveness is captured by a set of coal grinding matrices representing a fraction of coal moving from a coarser bin to a next finer bin over a length of time, and the coal grinding matrix represents the grinding effectiveness, and the coal grinding matrix is used for predicting mill current pressure and mill differential pressure, wherein the physics-based models are used for the real-time determination of the grinding effectiveness by optimizing the grinding effectiveness value such that the predicted output comprising the coal size distribution matches real measurement comprising coal size distribution at the inlet and outlet of mill in the plant; and
      the data-driven models include machine learning regression, Kalman filter, clustering, or classification;
   post establishing the grinding effectiveness of the pulverizer mill, predicting, via the one or more hardware processors, by a plurality of condition monitoring models, a plurality of key operating events of the pulverizer mill using the soft sensed plurality of key performance and health parameters, coal quality parameters and the preprocessed plurality of data, wherein the key performance parameters comprises outgoing coal fineness, internal coal accumulation, outgoing coal flow, mill current, mill differential pressure and coal moisture, wherein the coal quality parameters comprises coal calorific value, coal hardness, coal incoming moisture, wherein the plurality of key operating events are associated with adverse conditions in the pulverizer mill, wherein the adverse conditions include one or more of a high operation cost, an operating regime shift, coal property variations, component degradation, safety risks and environmental risks pertaining to an operation of the pulverizer mill, monitoring operating regime changes and fuel quality changes, wherein the component degradation includes monitoring indicators of roller, table, and gearbox degradation, such as vibrations and current, wherein the plurality of condition monitoring models use the preprocessed data, maintenance information, mill design and mill specific information, predicted performance and coal quality parameters from the set of soft sensing models, wherein the plurality of condition monitoring models observe trends in coal accumulated which is soft sensed by soft sensing models in each zone of mill over a time and raise an alarm if there is a shift in the coal accumulated trends;
   estimating, via the one or more hardware processors, a current health index and a future health index using a plurality of health index models, wherein the health index provides indication of one or more of suboptimal operation, deterioration of components and possible faults and anomalies, despite variations in upstream-downstream conditions, ambient conditions, coal property variations and operating regime changes and wherein the health index is a function of measured parameters, the soft sensed plurality of key performance and health parameters, coal quality parameters and maintenance and design data of the pulverizer mill, wherein the plurality of health index models are pre-generated models;
   receiving, via a digital twin, real-time sensor data from the one or more data sources and mimicking performance of the pulverizer mill in real time;
   comparing, via the one or more hardware processors, the current health index and the future health index with a threshold health index, diagnose the current health and future health of the pulverizer mill, wherein the diagnosis comprises of identifying and localization of faults, a root cause analysis of the faults, and estimating a remaining useful life (RUL) of the pulverizer mill and its components;
   providing, via the one or more hardware processors, a set of operating recommendations to the pulverizer mill to mitigate the adverse conditions in the pulverizer mill based on the plurality of key operating events and the diagnosis;
   recommending, via the one or more hardware processors, corrective actions in terms of the plurality of key performance and health parameters of the pulverizer mill and coal quality parameters;
   providing, via the one or more hardware processors, optimal maintenance and scheduling recommendations using maintenance optimizer models, based on the estimated current health index, the future health index and the estimated remaining useful life of the pulverizer mill; and
   calibrating, via the one or more hardware processors, existing models to adapt to a current performance and requirements of the pulverizer mill and the plant.

2. The method of claim 1, further comprises enabling automatic update of models if performance of models is found below a set threshold.

3. The method of claim 1, wherein the one or more data sources comprises a distributed control system (DCS), one or more of Supervisory Control and Data Acquisition (SCADA) System, Enterprise Resource Planning (ERP) system, a historian, a laboratory information management system (LIMS), Manufacturing Execution System (MES), Manufacturing Operations Management System (MOM), databases, a plurality of sensors, external sources, manual input, and a well sensor database.

4. The method of claim 1, wherein the plurality of performance and health parameters comprises a grinding effectiveness index, coal accumulated in the pulverizer mill, an outgoing coal fineness, a mill current, a mill differential pressure and moisture, a motor current, a coal flow rate, an air flow rate, a hydraulic oil pressure, a roller gap, a bowl differential pressure, a lubricating oil temperature, vibrations, a classifier rotations per minute (RPM), a plurality of set points from control system, an inlet-outlet air temperature, and pressure.

5. A system for performance and health monitoring to optimize operation of a pulverizer mill, the system comprises:
an input/output interface;
one or more hardware processors;
a memory in communication with the one or more hardware processors, wherein the one or more first hardware processors are configured to execute programmed instructions stored in the one or more first memories, to:
receive a plurality of data as input data from one or more data sources, wherein the plurality of data comprises:
a plurality of current and historical measurements by a plurality of sensors installed on the pulverizer mill and upstream-downstream equipment, comprising of flow rates, pressures, temperatures, concentrations and control system set points;
a plurality of current and historical coal properties data comprising of a hardness index, a calorific value and an ultimate and proximate analysis of coal; and
a maintenance and design data comprising of the pulverizer mill and, historical record of maintenance, dimensional and design specific information of the pulverizer mill;
preprocess the plurality of data and storing the preprocessed plurality of data in a database, wherein the pre-processing further comprises:
identification and removal of outliers from the plurality of data;
imputation of missing data from the plurality of data; and
synchronization and integration of a plurality of variables from the one or more data sources using the residence time of a plurality of units of the pulverizer;
soft sense in real time a plurality of key performance and health parameters of the pulverizer mill and coal quality parameters using the preprocessed plurality of data and a set of soft sensing models,
wherein the set of soft sensing models comprises a set of physics-based models for real-time determination of grinding effectiveness preceded by data-driven models, wherein the set of physics-based models solve a set of differential and algebraic equations representing transport, drying and grinding of coal within different zones of the pulverizer mill, and wherein the grinding effectiveness is captured by a set of coal grinding matrices representing a fraction of coal moving from a coarser bin to a next finer bin over a length of time, and the coal grinding matrix represents the grinding effectiveness, and the coal grinding matrix is used for predicting mill current pressure and mill differential pressure, wherein the physics-based models are used for the real-time determination of the grinding effectiveness by optimizing the grinding effectiveness value such that the predicted output comprising the coal size distribution matches real measurement comprising coal size distribution at the inlet and outlet of mill in the plant; and
the data-driven models include machine learning regression, Kalman filter, clustering, or classification;
post establishing the grinding effectiveness of the pulverizer mill, predict by a plurality of condition monitoring models, a plurality of key operating events of the pulverizer mill using the soft sensed plurality of key performance and health parameters, coal quality parameters and the preprocessed plurality of data, wherein the key performance parameters comprises outgoing coal fineness, internal coal accumulation, outgoing coal flow, mill current, mill differential pressure and coal moisture, wherein the coal quality parameters comprises coal calorific value, coal hardness, coal incoming moisture, wherein the adverse conditions include a high operation cost, an operating regime shift, coal property variations, component degradation, safety risks and environmental risks pertaining to an operation of the pulverizers, monitoring operating regime changes and fuel quality changes, wherein the component degradation includes monitoring indicators of roller, table, and gearbox degradation, such as vibrations and current, wherein the plurality of condition monitoring models use the preprocessed data, maintenance information, mill design and mill specific information, predicted performance and coal quality parameters from the set of soft sensing models, wherein the plurality of condition monitoring models observe trends in coal accumulated which is soft sensed by soft sensing models in each zone of mill over a time and raise an alarm if there is a shift in the coal accumulated trends;
estimate a current health index and a future health index using a plurality of health index models, wherein the health index provides indication of one or more of suboptimal operation, deterioration of components and possible faults and anomalies, despite variations in upstream-downstream conditions, ambient conditions, coal property variations and operating regime changes and wherein the health index is a function of measured parameters, the soft sensed plurality of key performance and health parameters, coal quality parameters and maintenance and design data of the pulverizer mill, wherein the plurality of health index models are pre-generated models;
receive real-time sensor data from the one or more data sources and mimicking performance of the pulverizer mill in real time;
compare the current health index and the future health index with a threshold health index, diagnose the current health and future health of the pulverizer mill, wherein the diagnosis comprises of identifying and localization of faults, a root cause analysis of the faults, and estimating a remaining useful life (RUL) of the pulverizer mill and its components;

provide a set of operating recommendations to the pulverizer mill to mitigate the adverse conditions in the pulverizer mill based on the plurality of key operating events and the diagnosis;

recommend corrective actions in terms of the plurality of key performance and health parameters of the pulverizer mill and coal quality parameters;

provide optimal maintenance and scheduling recommendations using maintenance optimizer models, based on the estimated current health index, the future health index and the estimated remaining useful life of the pulverizer mill; and calibrate existing models to adapt to a current performance and requirements of the pulverizer mill and the plant.

6. One or more non-transitory machine-readable information storage mediums comprising one or more instructions which when executed by one or more hardware processors cause:

receiving a plurality of data as input data from one or more data sources, wherein the plurality of data comprises:

a plurality of current and historical measurements by a plurality of sensors installed on the pulverizer mill and upstream-downstream equipment, comprising of flow rates, pressures, temperatures, concentrations and control system set points;

a plurality of current and historical coal properties data comprising of a hardness index, a calorific value and an ultimate and proximate analysis of coal; and a maintenance and design data comprising of the pulverizer mill and, historical record of maintenance, dimensional and design specific information of the pulverizer mill;

preprocessing the plurality of data and storing the preprocessed plurality of data in a database, wherein the pre-processing further comprises:

identification and removal of outliers from the plurality of data;

imputation of missing data from the plurality of data; and synchronization and integration of a plurality of variables from the one or more data sources using the residence time of a plurality of units of the pulverizer;

soft sensing in real time, via the one or more hardware processors, a plurality of key performance and health parameters of the pulverizer mill and coal quality parameters using the preprocessed plurality of data and a set of soft sensing models, wherein the set of soft sensing models comprises a set of physics-based models for real-time determination of grinding effectiveness preceded by data-driven models, wherein the set of physics-based models solve a set of differential and algebraic equations representing transport, drying and grinding of coal within different zones of the pulverizer mill, and wherein the grinding effectiveness is captured by a set of coal grinding matrices representing a fraction of coal moving from a coarser bin to a next finer bin over a length of time, and the coal grinding matrix represents the grinding effectiveness, and the coal grinding matrix is used for predicting mill current pressure and mill differential pressure, wherein the physics-based models are used for the real-time determination of the grinding effectiveness by optimizing the grinding effectiveness value such that the predicted output comprising the coal size distribution matches real measurement comprising coal size distribution at the inlet and outlet of mill in the plant; and the data-driven models include machine learning regression, Kalman filter, clustering, or classification;

post establishing the grinding effectiveness of the pulverizer mill, predicting, via the one or more hardware processors, by a plurality of condition monitoring models, a plurality of key operating events of the pulverizer mill using the soft sensed plurality of key performance and health parameters, coal quality parameters and the preprocessed plurality of data, wherein the key performance parameters comprises outgoing coal fineness, internal coal accumulation, outgoing coal flow, mill current, mill differential pressure and coal moisture, wherein the coal quality parameters comprises coal calorific value, coal hardness, coal incoming moisture, wherein the plurality of key operating events are associated with adverse conditions in the pulverizer mill, wherein the adverse conditions include one or more of a high operation cost, an operating regime shift, coal property variations, component degradation, safety risks and environmental risks pertaining to an operation of the pulverizer mill, monitoring operating regime changes and fuel quality changes, wherein the component degradation includes monitoring indicators of roller, table, and gearbox degradation, such as vibrations and current, wherein the plurality of condition monitoring models use the preprocessed data, maintenance information, mill design and mill specific information, predicted performance and coal quality parameters from the set of soft sensing models, wherein the plurality of condition monitoring models observe trends in coal accumulated which is soft sensed by soft sensing models in each zone of mill over a time and raise an alarm if there is a shift in the coal accumulated trends;

estimating, via the one or more hardware processors, a current health index and a future health index using a plurality of health index models, wherein the health index provides indication of one or more of suboptimal operation, deterioration of components and possible faults and anomalies, despite variations in upstream-downstream conditions, ambient conditions, coal property variations and operating regime changes and wherein the health index is a function of measured parameters, the soft sensed plurality of key performance and health parameters, coal quality parameters and maintenance and design data of the pulverizer mill, wherein the plurality of health index models are pre-generated models;

receiving, via a digital twin, real-time sensor data from the one or more data sources and mimicking performance of the pulverizer mill in real time;

comparing, via the one or more hardware processors, the current health index and the future health index with a threshold health index, diagnose the current health and future health of the pulverizer mill, wherein the diagnosis comprises of identifying and localization of faults, a root cause analysis of the faults, and estimating a remaining useful life (RUL) of the pulverizer mill and its components;

providing, via the one or more hardware processors, a set of operating recommendations to the pulverizer mill to mitigate the adverse conditions in the pulverizer mill based on the plurality of key operating events and the diagnosis;

recommending, via the one or more hardware processors, corrective actions in terms of the plurality of key performance and health parameters of the pulverizer mill and coal quality parameters;

providing, via the one or more hardware processors, optimal maintenance and scheduling recommendations using maintenance optimizer models, based on the estimated current health index, the future health index and the estimated remaining useful life of the pulverizer mill; and calibrating, via the one or more hardware processors existing models to adapt to a current performance and requirements of the pulverizer mill and the plant.

* * * * *